United States Patent [19]
Arnold et al.

[11] Patent Number: 5,423,971
[45] Date of Patent: Jun. 13, 1995

[54] ARRANGEMENT FOR COATING SUBSTRATES

[75] Inventors: Manfred Arnold, Meckenbeuren; Guido Blang, Nauheim; Rainer Gegenwart, Rödermark; Klaus Michael, Gelnhausen; Michael Scherer, Rodenbach; Jochen Ritter, Laubach; Oliver Burkhardt, Hanau, all of Germany

[73] Assignee: Leybold Aktiengesellschaft, Hanau, Germany

[21] Appl. No.: 179,216
[22] Filed: Jan. 10, 1994

[30] Foreign Application Priority Data
Jan. 19, 1993 [DE] Germany ............ 43 01 189.6

[51] Int. Cl.6 ............................ C23C 14/34
[52] U.S. Cl. ............ 204/298.11; 204/298.07; 204/298.23; 204/298.25; 204/298.35; 118/718; 118/719; 118/723 E; 118/729
[58] Field of Search .......... 204/298.07, 298.11, 204/298.23, 298.25, 298.35; 118/718, 719, 729, 723 E

[56] References Cited

U.S. PATENT DOCUMENTS

| | | | |
|---|---|---|---|
| 3,461,054 | 8/1969 | Vratny | 204/192.15 |
| 3,617,459 | 11/1971 | Logan | 204/192.23 |
| 3,767,551 | 10/1973 | Lang, Jr. et al. | 204/192.12 |
| 3,787,312 | 1/1974 | Wagner et al. | 204/298.11 |
| 4,116,806 | 9/1978 | Love et al. | 204/298.19 |
| 4,424,101 | 1/1984 | Nowicki | 204/192.23 |
| 4,572,842 | 2/1986 | Dietrich et al. | 427/571 |
| 4,719,154 | 1/1988 | Hatwar | 428/694 |
| 4,728,406 | 3/1988 | Banerjee et al. | 204/192.29 |
| 4,800,174 | 1/1989 | Ishihara et al. | 437/101 |
| 4,803,947 | 2/1989 | Ueki et al. | 118/719 |
| 4,851,095 | 7/1989 | Scobey et al. | 204/192.12 |
| 4,874,494 | 10/1989 | Ohmi | 204/192.12 |
| 4,920,917 | 5/1990 | Nakatani et al. | 118/718 |
| 4,931,169 | 6/1990 | Scherer et al. | 204/298.11 |
| 5,180,434 | 1/1993 | DiDio et al. | 118/718 |
| 5,228,968 | 7/1993 | Zejda | 204/298.07 |

FOREIGN PATENT DOCUMENTS

| | | |
|---|---|---|
| 0347567 | 12/1989 | European Pat. Off. |
| 3700633 | of 0000 | Germany |
| 2102352 | 7/1971 | Germany |
| 2241229 | 3/1974 | Germany |
| 2909804 | 9/1980 | Germany |
| 3310797 | 9/1983 | Germany |
| 3708717 | 9/1988 | Germany |

OTHER PUBLICATIONS

F. Vratny: Deposition of Tantalum and Tantalum Oxides by Superimposed RF and DC Sputtering, *J. Electrochem. Soc.*, Vol. 114, No. 5 May 1967, pp. 505–508.

K. Köhler, J. W. Coburn, D. E. Horne, E. Kay: Plasma potential of 13.56 MHz rf argon glow discharges in a planary system, *J. Appl. Phys.*, vol. 51 (1), Jan. 1985, pp. 59–66.

New mode of plasma deposition in a capacitively coupled reactor, T. Hamasaki et al, *Appl. Phys. Lett.* vol. 44 (11) 1 Jun. 1984, pp. 1049–1051.

*Primary Examiner*—Aaron Weisstuch
*Attorney, Agent, or Firm*—Felfe & Lynch

[57] ABSTRACT

The invention relates to an electrode configuration for a device for generating a plasma. RF is coupled contactlessly via a capacitive coupling electrode disposed at the dark space distance into a carrier backside of a coating installation. Dark space shields on the coating side define the plasma zone and prevent the formation of parasitic plasmas. HF substrate bias voltage on the moving substrate carrier is achieved with a defined plasma zone and the development of parasitic plasmas is avoided.

12 Claims, 1 Drawing Sheet

ARRANGEMENT FOR COATING SUBSTRATES

BACKGROUND OF THE INVENTION

The invention relates to an arrangement for coating substrates.

In numerous etching and coating processes plasmas are generated out of which ions are accelerated onto a substrate. In order to be able to control the thickness of layers or the depth of etching, a dc voltage is provided between two electrodes which enclose a plasma.

If electrically non-conducting layers are to be deposited on a substrate, instead of a dc voltage an ac voltage must be applied in order to build up a dc potential at the substrate, which is required for the acceleration of charged particles, in particular of ions, in the direction toward the substrate.

For the coating or etching effect the generation of a stationary potential difference between plasma and electrode is essential, which in the case of a HF voltage applied at the electrode is achieved such that during the positive half period significantly more electrons can stream onto the electrode surface than positive ions can escape from it during the negative half period. But since averaged over time an identical quantity of positive and negative charge carriers are carried out of the plasma, the electrode becomes negatively charged relative to the plasma until almost throughout the entire length of both periods positive ions can stream in. Positive space charge regions leading to a rectifier effect are generated near the electrodes and lead to the formation of a barrier layer capacitance (cf. DE 37 08 717, column 5, line 20 to column 6, line 6).

DESCRIPTION OF THE PRIOR ART

In the case of cathode sputtering, including reactive sputtering of dielectric oxides it is already known to superimpose an ac voltage onto the dc voltage present between two electrodes (U.S. Pat. No. 3,461,054). Above the cathode and below the anode there is provided a sputter diaphragm, while the substrate to be coated is disposed on the anode. Due to the disposition of the substrate on a stationary anode it is not possible with a device of this type to maintain the sputtering process if the substrate is moving, e.g. if the sputtering process is a dynamic coating process using an in-line system.

The same applies for further known ac current feeds to electrodes which enclose a plasma volume (U.S. Pat. Nos. 4,874,494, 4,719,154, 4,424,103, 3,767,551, 3,617,459, 4,572,842; F. Vratny: "Deposition of Tantalum and Tantalum Oxides by Superimposed RF and DC Sputtering", *J. Electrochem.* Soc., Vol. 114, No. 5, May 1967, p. 506, FIG. 1; EP-A-0 347 567; K. Köhler, J. W. Coburn, D. E. Horne, E. Kay: "Plasma potential at 13.56 MHz rf argon glow discharges in a planar system", *J. Appl. Phys*, Vol. 51 (1), Jan. 1985, pp. 59–66).

A high frequency-operated sputtering arrangement is also known, which comprises a flat anode implemented as a substrate carrier and a flat cathode disposed so as to oppose the anode (DE-OS 21 02 353). This arrangement comprises, in addition, an anticathode comprising a material to be deposited on a substrate, wherein the anticathode is disposed on the side facing the cathode. This arrangement is also not suitable for coating substrates in an in-line operation.

Furthermore, there is known an arrangement in which substrates to be coated are moved within a receptacle (DE-OS 29 09 804). The high-frequency voltage for the generation of a plasma is herein applied via electrical lines connected to a substrate holder and to a target holder. Details about the disposition and mounting of the substrate are not shown.

Also known is an arrangement for the precise coating of electrically conducting objects by means of plasmas in which a screen is provided behind a target connected to an electrical voltage (DE-OS 37 00 633). However, this arrangement is a parallel plate reactor in which no stable coupling of HF energy into a carrier is possible; rather, secondary plasmas would ignite.

In order to be able in the dynamic coating performed in in-line systems in which the substrates are carried by a transport system during the coating past the coating source, to apply high-frequency voltage to the electrodes, it is conceivable to couple them galvanically via a sliding or roller contact. However, parasitic plasmas would occur in the region of the voltage coupling, which could only be suppressed through a technically expensive dark space shield of the transport system. Moreover, the sliding or roller contacts would in time become coated, which would exert a negative effect on the power transfer especially if the coating comprises an electric insulator. Added to this is the fact that the strong mechanical strain occurring when using sliding contacts or contact rollers would support the generation of particles which, in turn, reduce the quality of the coating layer.

Lastly, an arrangement for etching substrates through a glow discharge is also known, in which the volume between an electrode and the substrate or substrate carrier is bridged except for a gap of approximately 5 mm so that the glow discharge is limitable to the volume between substrate carrier and electrode (DEP 22 41 229). This arrangement, however, is also not suitable for in-line installations, since it comprises a stationary substrate carrier.

SUMMARY AND OBJECT OF THE INVENTION

The invention is based on the task of coupling energy into an in-line installation through a substrate carrier into the plasma volume without parasitic plasmas occurring therein.

The advantage achieved with the invention resides in particular in being able to couple a defined HF bias into a moving substrate of an in-line installation without interfering plasmas and/or particles occurring therein. By carrying the substrate carrier past a planar electrode at the dark space distance it is possible to introduce HF power capacitively through the substrate carrier and the substrates into the plasma volume, whereby a bias potential results at the substrate with simultaneous ion bombardment. The electrode shields are therein selected so that no plasma can escape from the plasma volume. It is hereby prevented that in the case of a plasma CVD process a layer is deposited on the substrates in a non-controlled manner.

Embodiment examples of the invention are depicted in the drawing and will be described in further detail in the following.

DETAILED DESCRIPTION OF THE INVENTION

Figure 1:
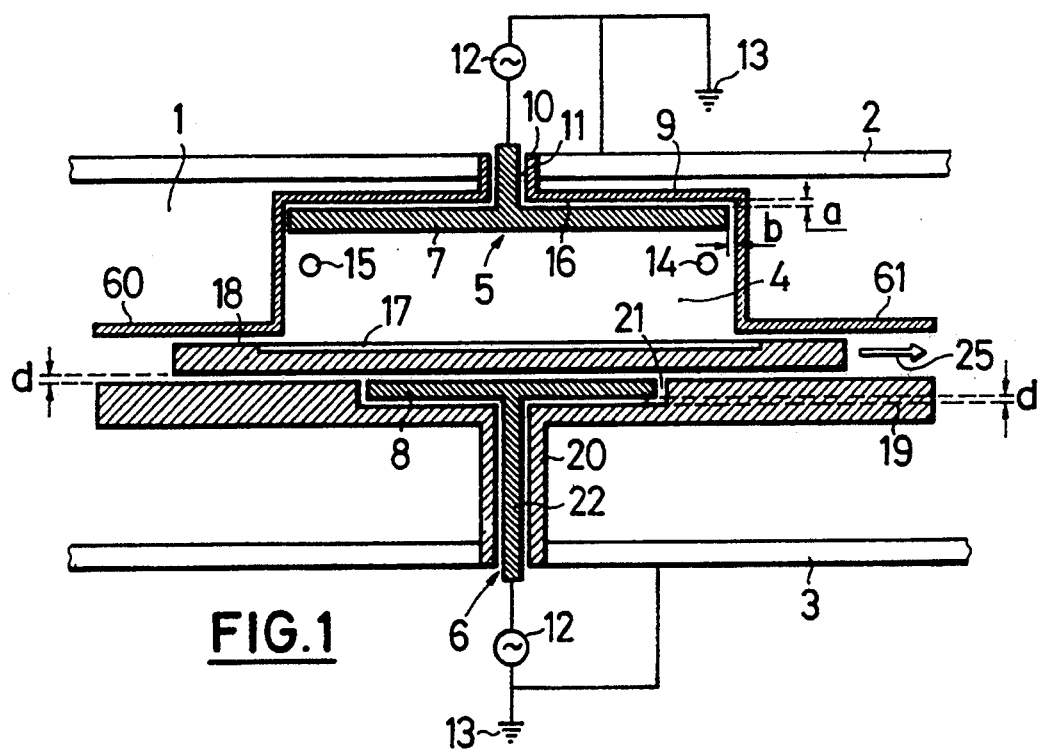
FIG. 1 shows a sputtering installation with a movable substrate carrier wherein between two electrodes a plasma volume is provided and a high-frequency voltage is applied at both electrodes.

In FIG. 1 there is depicted schematically a process chamber 1 which is bounded by an upper wall 2 and a lower wall 3. Between the two walls 2, 3 of the process chamber 1 there is disposed a plasma volume 4 bounded by an upper electrode 5 and a lower electrode 6. Both electrodes 5, 6 are implemented in T-form wherein the area 7 of the upper electrode 5 is, however, somewhat larger than the area 8 of the lower electrode 6.

The upper electrode 5 is encompassed by a pot-form dark space shield 9 which comprises at its upper portion a tube-form connection piece 10 whose outside rests on the inner wall of a bore in wall 2. The electrode 5 is guided through this connection piece 10 with a shank 11 disposed perpendicularly to face 7, wherein this shank 11 is connected to a terminal of a high-frequency ac voltage source 12. The other terminal of this ac voltage source 12, together with wall 2, is at ground potential 13. In the dark space shield 9 and below face 7 of the electrode 5 there are disposed gas lines 14, 15 through which process gases are introduced into the plasma volume 4. These process gases are, for example, $SiH_4$ and $N_2O$. Instead of through gas lines 14, 15 the process gas can also be introduced into the plasma volume 4 through an interspace 16 between electrode 5 and the dark space shield 9. Because of the plasma present there the gas is dissociated to form highly reactive radicals which react through impacts preferably against chamber walls etc. to form the final product, for example $SiO_2$.

The lower boundary of the plasma chamber 4 is formed by a substrate 17 which is positioned in a substrate carrier 18. This substrate carrier 18 can be guided over a lower dark space shield 19 for the lower electrode 6. Similar to the upper dark space shield 9, the lower dark space shield 19 also has a tube-form connection piece 20, which abuts with its outside on the inner wall of a throughbore in wall 3. In contrast to the upper dark space shield 9, however, the lower dark space shield 19 is not implemented in pot-form but rather has the shape of a disk in which is disposed a recess 21 for receiving the face 8 of the lower electrode 6. A shank 22 perpendicular to face 8 is connected to a terminal of the high-frequency source 12 while wall 3 is at ground potential 13.

The plasma disposed in the plasma chamber 4 is ignited by applying the voltage of the voltage source 12 to the upper electrode 5. This voltage is preferably a high-frequency voltage of 13.56 MHz. In order to achieve higher coating rates, permanent magnets can be built into the electrode whereby an RF magnetron operation results.

The dark space shields 9 and 19 prevent the development of parasitic plasmas on the backsides of electrodes 5 or 8. Moreover, they also form the lateral boundary of the discharge zone.

The substrate 17 to be coated is recessed in the recess of substrate carrier 18 and can be carried past the electrode 5 or the plasma space 4 by means of the substrate carrier. The motion of the substrate carrier 18 is indicated by an arrow 25. The substrate carrier 18 can be significantly longer than shown in FIG. 1 and can carry several substrates one behind the other. Therewith it is possible to coat different substrates sequentially.

Through the arrangement and implementation of the electrodes 5, 8 the HF energy of the voltage source 12 is coupled capacitively into the plasma volume 4.

The distance d between the lower electrode 8 and the substrate carrier 18 cannot exceed the dark space distance so that no parasitic plasma is ignited. For the same reason the distance a or b of the upper electrode 5 from the dark space shield 9 is smaller than the dark space distance. The capacitance of electrode 5 relative to the carrier 18 should be as large as possible while the mass of the electrode should be as small as possible in order To be able to build up an efficient dc potential at the substrate carrier 19. The substrate carrier 19 is also shielded on the front and rear side beyond the region of the coating zone at the dark space distance. Therewith an entrainment of the plasma zone and the development of parasitic plasmas is counteracted. The substrate carrier 19 itself is implemented so that it remains decoupled in terms of dc current from the—not shown—transport system, whereby this transport system can be connected to ground potential in a defined way.

Figure 2:
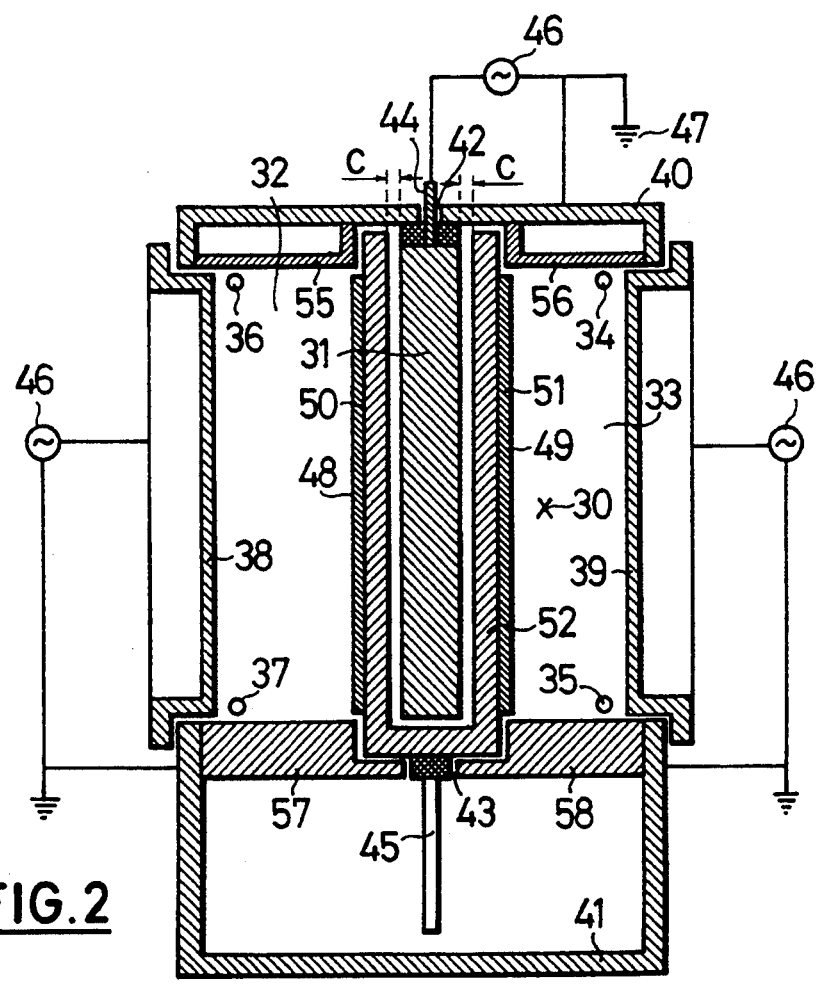
FIG. 2 shows a sputtering installation according to the installation of FIG. 1 in which, however, two opposing substrates can be coated simultaneously and a center electrode is provided at a voltage between the electrodes.

In FIG. 2 there is depicted a further embodiment of the capacitive coupling of HF energy. Here too substrates are coated in an in-line installation, for example dynamically, in a sputtering process, e.g. by moving past a plasma source. The motion of the substrate takes place into the plane of the drawing which is indicated by the symbol with reference number 30.

The arrangement depicted in FIG. 2 is tilted by 90 degrees relative to the arrangement according to FIG. 1, e.g. the electrodes are now no longer at the top and the bottom but rather at the left and right side. Moreover, with the arrangement according to FIG. 2 coating can take place bilaterally since a center electrode is provided between the side electrodes.

Through the center electrode 31 and the two side electrodes 38, 39 two vacuum or plasma chambers 32, 33 are formed, in which in each instance separate gas feeds 34, 35 or 36, 37 are provided. At the top and the bottom these plasma chambers 32, 33 are closed off by U-form walls 40, 41. These walls 40, 41 comprise in each instance a slit 42, 43 through which a shank 44 or 45 of the center electrode 31 is guided. The shank 44 is connected to one terminal of a dc or ac voltage source 46 whose other terminal is connected to ground 47. The wall 40 is also connected with ground 47.

If the voltage source 46 is an ac voltage source, it preferably provides a voltage of 13.56 MHz. The voltage source 46 is also connected with the electrodes 38, 39 so that in the volumes 32, 33 a plasma is ignited if rare gases are introduced through the inlet tubes 34 to 37, which are ionized and accelerated in the direction toward the electrodes 38, 39. The high energy of the impinging ions causes material to be knocked out of the surfaces of the electrodes 38, 39, which material is deposited as a layer on substrates 48, 49. The substrates 48, 49 are disposed on the outsides 50, 51 of a U-form substrate carrier 52 with a transport mechanism, not shown, which engages shank 45, and can be moved through the coating installation. In order to generate as few interfering foreign particles as possible, the transport mechanism is disposed in the lower region of the chamber, which region is bounded by wall 41. The substrate carrier 52 proper is electrically insulated from the transport mechanism, not shown, and at the upper end is without any contact with any other body. It also does not have any guide rollers which due to abrasion would contribute considerably to the particle contamination. Between the two sides of the U-form substrate carrier 52 there is disposed the center electrode 31 which has a distance c from the two sides corresponding to the dark space distance.

The center electrode 31, consequently, serves as a coupling electrode for the U-form substrate carrier 52. To avoid development of parasitic plasmas the substrate carrier is encompassed on the outside by suitable dark shields 55, 56 and 57, 58.

In both embodiment examples it is ensured that the region in which a plasma can burn is limited to the coating volume proper. Interfering parasitic plasmas are effectively suppressed. Moreover, through the contactless coupling of the HF power it is avoided that abrasion particles are formed. A further advantage of the contact-less particle-free coupling of the HF power is that through the planar power feed the fluctuations of the HF bias voltages over the substrate surface or over the substrate carrier surface are significantly less than is the case in galvanic coupling in which the power is fed in at particular contact sites. Hereby better homogeneities of the layer properties or the etching distribution obtain.

We claim:

1. An arrangement for coating substrates with a process chamber including:
   a first planar electrode connected to a source of dc or ac potential;
   a second planar electrode opposite said first electrode and connected to a source of dc or ac potential;
   a first shield surrounding the first planar electrode;
   a movable substrate carrier disposed at a given distance from the first electrode, characterized in that the substrate carrier is provided between and spaced from the two planar electrodes and is movable parallel to the faces of these electrodes;
   the first shield extends from the first planar electrode into the proximity of one surface of the substrate carrier or to a surface of the substrate, which shield together with the first electrode and the substrate encloses a plasma volume with gas inlet;
   the second planar electrode is provided with a second shield; and
   the distances of the electrodes from the shields and the substrate carrier are smaller than the dark space distance.

2. An arrangement as stated in claim 1, characterized in that the first shield is of pot-form, wherein the open region is directed toward the substrate carrier.

3. An arrangement as in claim 2, characterized in that the pot-form first shield comprises an edge disposed in close proximity to the substrate carrier and parallel to its upper surface.

4. An arrangement as in claim 1, characterized in that the second shield is a plate with a recess in which the second electrode is accommodated.

5. An arrangement as in claim 1, characterized in that the substrate carrier comprises on its upper side a recess in which the substrate is embedded.

6. An arrangement as in claim 1, characterized in that the first and the second electrodes form a plasma volume having a gas inlet.

7. An arrangement as in claim 6, characterized in that the gas inlet of said plasma volume is a slot between said process chamber and said plasma volume, so that gas can flow from the process chamber to said plasma volume.

8. An arrangement as in claim 1, characterized in that the first and second shields each comprise a connection piece through which an extension of the associated electrode is connected electrically with a voltage source.

9. An arrangement as stated in claim 1, characterized in that the first electrode comprises two outer electrodes and the second electrode comprises an inner electrode, wherein the inner electrode is bilaterally encompassed by a substrate carrier.

10. An arrangement as stated in claim 1, characterized in that the substrate carrier is displaceable relative to at least one electrode.

11. An arrangement as stated in claim 9, characterized in that between a first outer electrode and the inner electrode the substrate carrier is adapted to provide a first substrate and between the second outer electrode and the inner electrode the substrate carrier is adapted to provide a second substrate.

12. An arrangement as in claim 10, characterized in that the two outer electrodes are each connected To a first terminal of a voltage source, while the inner electrode is connected to a second terminal of said voltage source.

* * * * *

UNITED STATES PATENT AND TRADEMARK OFFICE
CERTIFICATE OF CORRECTION

PATENT NO : 5,423,971
DATED : June 13, 1995
INVENTOR(S): Arnold et al.

It is certified that error appears in the above-identified patent and that said Letters Patent is hereby corrected as shown below:

In column 1, line 50 of the Patent, change "4,424,103" to-- 4,424,101 --.

In Claim 12, column 6, line 45 of the Patent, delete "To" and substitute -- to --.

Signed and Sealed this

Seventh Day of July, 1998

*Attest:*

BRUCE LEHMAN

*Attesting Officer*  *Commissioner of Patents and Trademarks*